United States Patent [19]

Barrett

[11] Patent Number: 4,695,806

[45] Date of Patent: Sep. 22, 1987

[54] PRECISION REMOTELY-SWITCHED ATTENUATOR

[75] Inventor: Ronald A. Barrett, Westford, Mass.

[73] Assignee: Tektronix, Inc., Beaverton, Oreg.

[21] Appl. No.: 852,476

[22] Filed: Apr. 15, 1986

[51] Int. Cl.⁴ .............................................. H03G 3/30
[52] U.S. Cl. .................................... 330/254; 330/284
[58] Field of Search ............... 330/144, 145, 254, 284;
333/81 R; 307/540, 264

[56] References Cited

U.S. PATENT DOCUMENTS 4,523,153   6/1985   Itoh ..................................... 330/254

Primary Examiner—James B. Mullins
Attorney, Agent, or Firm—George T. Noe

[57] ABSTRACT

A precision remotely-switched active attenuator comprises a differential amplifier configured with a pair of operational amplifiers that stabilize bias voltages in the differential amplifier and cause more or less signal current to be diverted from an output in accordance with the value of a selectable resistor. Circuit gain can be varied from unity to zero, depending upon the value of the selectable resistor.

6 Claims, 1 Drawing Figure

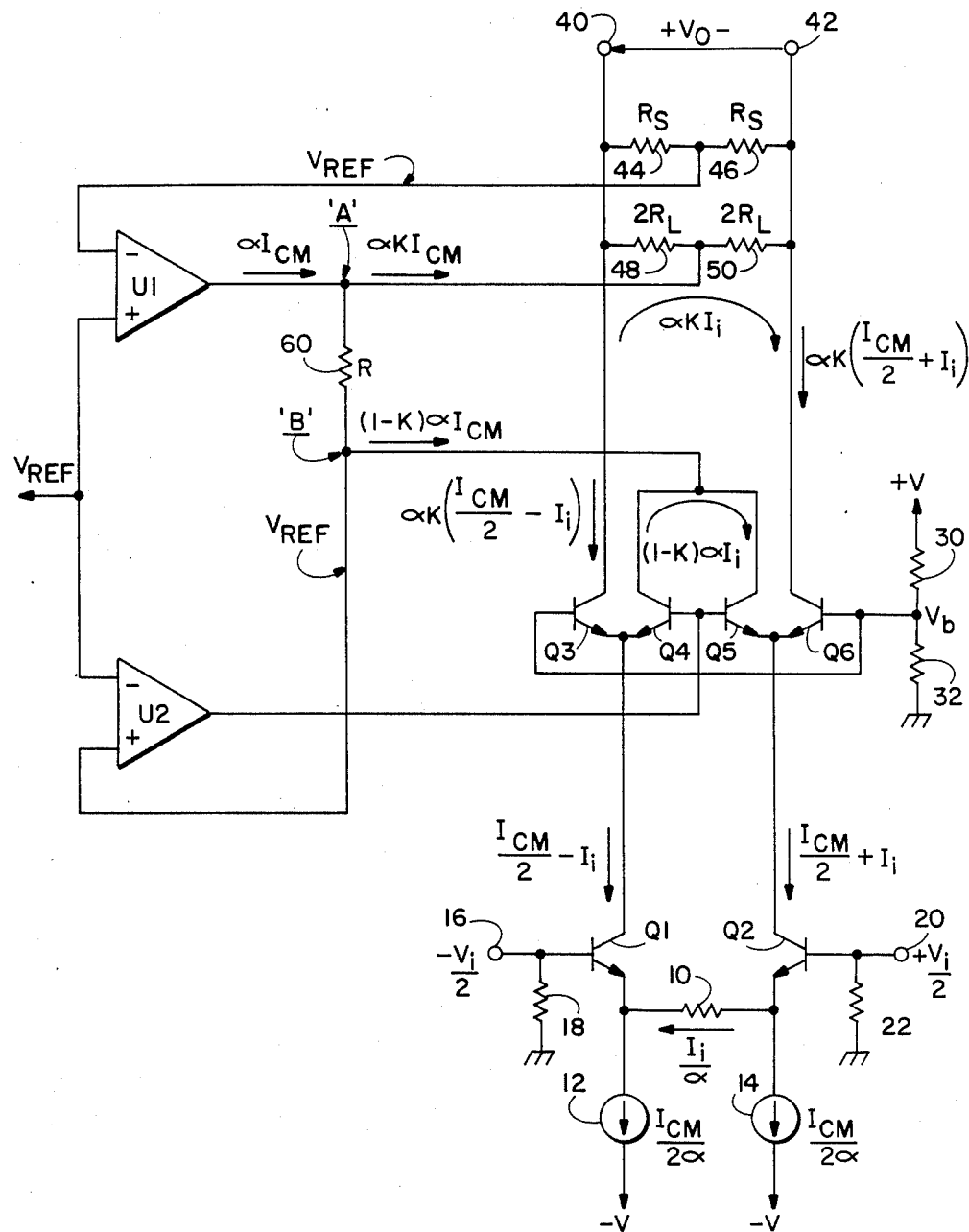

PRECISION REMOTELY-SWITCHED ATTENUATOR

BACKGROUND OF THE INVENTION

The subject matter of the present invention relates generally to electrical attenuators and switching therefor, and in particular to a precision remotely-switched attenuator which may provide variable attenuation ratios as well as fixed ratios.

In electronic instrumentation, attenuator stages and amplifier stages are common building blocks in designing the signal processing path. Historically, attenuators combined mechanically actuated switches or relays with passive electrical circuit elements. These electromechanical attenuators offered good DC and high-frequency performance as long as they were properly maintained; however, they are fixed in attenuation ratio, slow in switching, relatively expensive and bulky, and often unreliable as parts became worn, pitted, or dirty.

Programmable step attenuators have been developed in which mechanical switches have been replaced with electronic switches, such as bipolar or field-effect transistors Examples of this type of attenuator are shown in U.S. Pat. No. 4,121,183 to Desmond L. Murphy and U.S. Pat. No. 4,523,161 to Frank Miles, both of which are assigned to the assignee of the present invention.

Trends in semiconductor and hybrid-circuit technology have resulted in programmable electronic instruments which are smaller and lighter in weight, consume less power, and provide higher performance operation with greater reliability. Often these programmable instruments require remotely switched, electronically activated, fast-acting, variable attenuators.

SUMMARY OF THE INVENTION

In accordance with the present invention, an integrated-circuit differential amplifier is configured with a pair of operational amplifiers that stabilize bias voltages at a pair of critical circuit nodes and cause more or less signal current to be diverted from a pair of output ports in accordance with the value of a selectable resistor, thereby providing a precision remotely-switched active attenuator.

An important aspect of the invention is that the attenuation ratio selection components and switching elements lie outside the signal path and are isolated therefrom. Consequently, several advantages accrue from the present invention. Fast, sub-microsecond switching speeds are determined primarily by operational amplifier settling times. A wide range of attenuation ratios are possible, either variable or in fixed steps, and attenuation ratios are precisely determined by resistance values, resulting in highly accurate signal attenuation. The attenuator of the present invention exhibits excellent DC performance as well. Common-mode voltage levels are stabilized by operational amplifiers. The close matching of monolithic transistors minimizes differential offset. Excellent high-frequency performance is exhibited as well because the signal does not pass through any of the switching. Moreover, critical active device bias voltages do not change with attenuation ratio. Therefore, a simple, accurate, and highly reliable attenuator suitable for attenuation applications in electronic instruments such as oscilloscopes, signal sources, frequency counters, and network analyzers is provided.

BRIEF DESCRIPTION OF DRAWINGS

The single FIGURE is a schematic diagram of the preferred embodiment according to the present invention.

DETAILED DESCRIPTION OF THE PREFERRED EMBODIMENT

As shown in the single FIGURE of the drawing, a wideband differential amplifier comprises a lower pair of emitter-coupled transistors Q1 and Q2, across the bases of which is applied a differential input signal $V_i$, and two upper pairs of emitter-coupled transistors Q3-Q4 and Q5-Q6 operated as a common-base stage to produce a differential output signal $V_o$.

Discussing the lower pair of transistors Q1-Q2 first, the emitters of Q1 and Q2 are coupled together through a resistor 10, and also to a suitable source of supply voltage $-V$ through respective current sinks 12 and 14. Each of the current sinks 12 and 14 produces one-half of the common-mode bias current $I_{CM}$ required for operation of the circuit. The base of transistor Q1 is connected to an input terminal 16 and a biasing resistor 18, while the base of transistor Q2 similarly is connected to an input terminal 20 and a biasing resistor 22. The differential input signal $V_i$ is applied to input terminals 16 and 20, and the voltage developed across resistor 10 produces signal current $I_i$ which is algebraically added to the common-mode current $I_{CM}$ at the collectors of transistors Q1 and Q2.

It should be mentioned that the polarities of devices and voltages, and direction of current flow shown in the FIGURE have been chosen to facilitate mathematic relationships to aid in understanding the preferred embodiment of the present invention.

The emitters of transistors Q3 and Q4 are coupled together to the collector of transistor Q1, while the emitters of transistors Q5 and Q6 are coupled together to the collector of transistor Q2. The bases of transistors Q3 and Q6 are connected together to a suitable reference voltage $V_b$ provided by voltage divider resistors 30 and 32, while the bases of transistors Q4 and Q5 are connected together to the output of an operational amplifier U2, to be discussed later. The collectors of the outboard transistors Q3 and Q6 are connected to respective output terminals 40 and 42. A load resistor network 44-46-48-50 is connected between the collectors of transistors Q3 and Q6 to develop the differential output voltage signal $V_o$ thereacross. The collectors of the inboard transistors Q4 and Q5 are connected together to one end of a resistor 60, the other end of which is connected to the junction of resistors 48 and 50. Resistors 48 and 50 are equal valued resistors, each having a value $2R_L$. Resistor 60 represents the selectable resistance value R in setting the attenuation ratio K, where $K = R/(R + R_L)$, and will be discussed in detail below.

A first operational amplifier U1 has a non-inverting input coupled to a reference voltage source $V_{REF}$, and an inverting input coupled to the junction of resistors 44 and 46. Resistors 44 and 46 are equal valued resistors, each having a value $R_S$. The output of operational amplifier U1 is connected to the junction of resistors 60, 48, and 50. The resistance network 44-46-48-50 serves as the feedback path to the inverting input of operational amplifier U1. Typically, the values $R_S$ of resistors 44 and 46 are chosen to be much larger than the values $R_L$ of resistors 48 and 50, so that the feedback resistance is determined primarily resistors 44 and 46.

A second operational amplifier U2 has an inverting input coupled to the reference voltage source $V_{REF}$, and a non-inverting input coupled to the junction of resistor 60 and the common collectors of transistors Q4 and Q5. The output of operational amplifier U2 is coupled to the common bases of transistors Q4 and Q5, the collectors of which become the feedback path to the non-inverting input of operational amplifier U2.

In discussing operation of the circuit and understanding the mathematical relationships, we will assume ideal operational amplifiers (e.g., infinite gain, zero input currents and offsets, etc.) and matched transistors Q1-Q2 and Q3-Q4-Q5-Q6, such as may easily be achieved using conventional integrated circuit techniques. The gain A of the differential amplifier is equal to $V_o/V_i$, and is proportional to the attenuation ratio K, where $K=R/(R+R_L)$ as mentioned above. Output signal voltage $V_o = \alpha K 4 R_L' I_i$, where $\alpha$ is the common-base current gain of transistors Q3-Q4-Q5-Q6 and $R_L'$ is equal to the parallel combination of $R_S/2$ and $R_L$.

Note that if outboard transistors Q3 and Q6 are in full conduction, and inboard transistors Q4 and Q5 are off, a situation which exists when R=infinity, all of the signal current $\alpha I_i$ is developed across load resistors 48 and 50, and gain A is proportional to K=1. Note that if the opposite situation exists where R=0, outboard transistors Q3 and Q6 are off while i.bnoard transistors Q4 and Q5 are in full conduction, short circuiting the signal current $\alpha I_i$ at the Q4-Q5 collectors, and gain A is proportional to K=0 because no signal current reaches the output or the load resistors. From these two extremes, it can be discerned that selecting values of R between infinity and zero results in an attenuation ratio K between one and zero, respectively. The shifting of current between the outboard and inboard sets of transistors when different values of R are selected is due to the action of operational amplifiers U1 and U2, which maintain node B at $V_{REF}$ by changing the bias voltage at the bases of transistors Q4-Q5 with respect to the fixed voltage at the bases of transistors Q3-Q6 in response to the differing currents through resistor 60. Operational amplifier U1 supplies sufficient current to node 'A' to keep the common-mode voltage at output terminals 40 and 42 equal to the reference voltage $V_{REF}$. The common-mode voltages across resistors 60, 48 and 50 are thus forced to be equal by the actions of operational amplifiers U1 and U2. The current $\alpha I_{CM}$ supplied by operational amplifier U1 and shown entering node 'A' is divided between resistor 60 and the parallel combination of resistors 48 and 50 in the proportions $(1-K)$ and K, where $K=R/(R+R_L)$. Current $\alpha K I_{CM}$ out of node 'A' represents the common-mode collector current for transistors Q3-Q6. As common-mode current is shunted away from transistors Q3-Q6, differential gain is reduced proportionately.

While resistor 60 is depicted as a single resistor, it may be in actual practice several resistors of predetermined values to provide a number of selectable attenuation ratios Each resistor may be switched in or out of the circuit in any conventional manner, such as by electro-mechanical switches or relays, or by programmable electronic switches such as transistors or integrated circuit switches. Since the signal current $I_i$ does not pass through resistor 60, signal current does not pass through the switches, either. Thus, the switching does not occur in the signal path, and since the switching is isolated from the signal path, wideband performance is not affected. Switching speeds are determined primarily by operational amplifier settling times.

It can also be seen that high-precision attenuation ratios are determined primarily by the characteristics of R and $R_L$. Some typical resistor values may be $R_{10}=400$ ohms, $R_L=100$ ohms, and $R_S=100$ kilohms to provide a near unity voltage gain when R=infinity (resistor 60 switched out of the circuit). Then for $K=\frac{1}{2}$, R=100 ohms; for $K=\frac{1}{3}.5$, R=66.67 ohms; for K=1/5, R=25 ohms; and for K=1/10, R=11.11 ohms. These values are by way of example only. Resistor 60 could also be a potentiometer or a voltage-controlled resistor to provide a continuously variable attenuation ratio.

What I claim as being novel is:

1. An attenuator circuit, comprising:
   means for receiving an input signal and generating a signal current therefrom;
   differential amplifier means coupled to said input signal receiving means for providing a first signal current path and a second signal current path;
   attenuation-ratio determining means comprising a first operational amplifier having an output coupled to a first circuit node, load impedance means coupled between said first circuit node and said first signal current path and one input of said operational amplifier to complete a feedback path therefor, and selectable impedance means coupled between said first circuit node and a second circuit node, said second circuit node being connected to said second signal current path, wherein the attenuation ratio is determined by the said load impedance means and said selectable impedance means; and
   a second operational amplifier having a first input coupled to a reference potential, a second input coupled to said second circuit node to sense said attenuation ratio, and an output coupled to said differential amplifier means for controlling the proportionality of signal current between said first and second signal current paths in response to the attention ratio sensed at said second circuit node.

2. An attenuator circuit in accordance with claim 1 wherein said input signal receiving means comprises first and second transistors, the emitters of which are coupled together through a resistor across which said input signal is developed to generate said signal current, and wherein said differential amplifier means comprises third and fourth transistors, the emitters of which are coupled together to the collector of said first transistor, and fifth and sixth transistors, the emitters of which are coupled together to the collector of said second transistor, wherein the bases of said third and sixth transistors are coupled together and the collectors of said third and sixth transistors provide said first signal current path, and wherein the bases of said fourth and fifth transistors are coupled together and the collectors of said fourth and fifth transistors are coupled together and provide said second signal current path.

3. An attenuator circuit in accordance with claim 2 wherein said first, second, third, fourth, fifth and sixth transistors have matched operating characteristics.

4. An attenuator circuit in accordance with claim 2 wherein said load impedance means comprises first and second load resistors connected in series between the collectors of said third and sixth transistors to complete said first signal current path and develop an output signal thereacross, with the junction of said first and second resistors connected to said first circuit node, and wherein said first operational amplifier provides to first circuit node operating current for all of the transistors of said attenuator circuit.

5. An attenuator circuit in accordance with claim 2 wherein said attenuation ratio is equal to the ratio of said selectable impedance means to the sum of said selectable means and said load impedance means.

6. An attenuator circuit in accordance with claim 2 wherein said selectable impedance means comprises one or more resistors.

* * * * *